United States Patent
Dejaeger et al.

(10) Patent No.: US 11,205,747 B2
(45) Date of Patent: Dec. 21, 2021

(54) PIEZOELECTRIC TRANSDUCER

(71) Applicant: Commissariat à l'Energie Atomique et aux Energies Alternatives, Paris (FR)

(72) Inventors: Remy Dejaeger, Eveux (FR); Bruno Fain, Grenoble (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 452 days.

(21) Appl. No.: 16/248,593

(22) Filed: Jan. 15, 2019

(65) Prior Publication Data
US 2019/0229256 A1 Jul. 25, 2019

(30) Foreign Application Priority Data
Jan. 22, 2018 (FR) ....................... 1850472

(51) Int. Cl.
*H01L 41/09* (2006.01)
*H01L 41/083* (2006.01)
(Continued)

(52) U.S. Cl.
CPC ........ *H01L 41/0973* (2013.01); *F04B 43/046* (2013.01); *H01L 41/042* (2013.01);
(Continued)

(58) Field of Classification Search
CPC ............... H01L 41/0973; H01L 41/042; H01L 41/0471; H01L 41/0472; H01L 41/083;
(Continued)

(56) References Cited

U.S. PATENT DOCUMENTS 4,985,926 A * 1/1991 Foster .................. B06B 1/0625
310/366
2008/0122317 A1 * 5/2008 Fazzio .................. G01H 11/08
310/328
(Continued)

FOREIGN PATENT DOCUMENTS

EP 2039934 A1 3/2009
JP H0354383 A 3/1991

OTHER PUBLICATIONS

Preliminary Search Report in French Application No. FR1850472 dated Sep. 18, 2018, 2 pages.

*Primary Examiner* — J. San Martin
(74) *Attorney, Agent, or Firm* — Moreno IP Law LLC

(57) ABSTRACT

The invention concerns a piezoelectric transducer including: a conductive layer between first and second piezo-electric layers; first and third electrodes arranged on the front surface of the second piezoelectric layer; second and fourth electrodes arranged on the rear surface of the first piezoelectric layer; and a control circuit configured to: in a first operating phase, simultaneously apply a non-zero voltage to the first electrode, a non-zero voltage to the fourth electrode, and substantially zero voltages to the second and third electrodes; and in a second operating phase, simultaneously apply a non-zero voltage to the second electrode, a non-zero voltage to the third electrode, and substantially zero voltages to the first and fourth electrodes.

13 Claims, 4 Drawing Sheets

(51) Int. Cl.
*F04B 43/04* (2006.01)
*H01L 41/047* (2006.01)
*H01L 41/04* (2006.01)
*H04R 17/00* (2006.01)
*H01L 41/187* (2006.01)
*H01L 41/193* (2006.01)

(52) U.S. Cl.
CPC ...... *H01L 41/0471* (2013.01); *H01L 41/0472* (2013.01); *H01L 41/083* (2013.01); *H01L 41/187* (2013.01); *H01L 41/1876* (2013.01); *H01L 41/193* (2013.01); *H04R 17/00* (2013.01)

(58) Field of Classification Search
CPC . H01L 41/187; H01L 41/1876; H01L 41/193; F04B 43/046; H04R 17/00
See application file for complete search history.

(56) References Cited

U.S. PATENT DOCUMENTS

| | | | |
|---|---|---|---|
| 2010/0239444 A1 | 9/2010 | Nagao et al. | |
| 2012/0043855 A1* | 2/2012 | Kang | G01P 15/097 |
| | | | 310/329 |
| 2014/0177881 A1* | 6/2014 | Fanget | H01L 41/0825 |
| | | | 381/190 |

* cited by examiner

PIEZOELECTRIC TRANSDUCER

CROSS-REFERENCE TO RELATED APPLICATION

This application claims the priority benefit of French patent application number 18/50472 the content of which is hereby incorporated by reference in its entirety to the maximum extent allowable by law.

FIELD

The present disclosure concerns the field of piezoelectric transducers.

BACKGROUND

A piezoelectric transducer conventionally comprises a piezoelectric conversion element formed of a layer made of a piezoelectric material arranged between two electrodes.

The application of a voltage between the two electrodes generates an electric field in the piezoelectric layer, causing a mechanical deformation of the piezoelectric layer. Such an electromechanical transduction effect may be used for various applications, for example, to form an electromechanical actuator, a loudspeaker, an ultrasound wave generator, etc.

Conversely, the application of a mechanical deformation to the piezoelectric layer causes a variation of the electric field, and thus a charge storage in the two electrodes of the piezoelectric conversion element. Such an electromechanical transduction effect may be used for various applications, for example, to form a pressure or deformation sensor, a microphone, etc.

The present disclosure more particularly concerns the forming of electromechanical piezoelectric transducers.

It would be desirable to be able to at least partly improve certain aspects of known electromechanical piezoelectric transducers.

In particular, it would be desirable to be able to increase the amplitude of the mechanical displacement generated within the transducer for a given control voltage.

SUMMARY

Thus, an embodiment provides a piezoelectric transducer comprising:

a first piezoelectric layer made of a non-ferroelectric material, the first layer having a front surface and a rear surface;

a first conductive layer arranged on the front surface of the first piezoelectric layer;

a second piezoelectric layer made of a non-ferroelectric material arranged on the front surface of the first conductive layer;

a first electrode arranged on the front surface of the second piezoelectric layer;

a second electrode arranged on the rear surface of the first piezoelectric layer, opposite the first electrode;

a third electrode arranged on the front surface of the second piezoelectric layer;

a fourth electrode arranged on the rear surface of the first piezoelectric layer, opposite the third electrode; and a control circuit configured to:

in a first operating phase, simultaneously apply a non-zero voltage to the first electrode, a non-zero voltage to the fourth electrode, and substantially zero voltages to the second and third electrodes; and in a second operating phase, simultaneously apply a non zero voltage to the second electrode, a non-zero voltage to the third electrode, and substantially zero voltages to the first and fourth electrodes.

According to an embodiment, the first and second piezoelectric layers have identical polarizations $\vec{P}$, and the control circuit is configured to, in the first configuration, apply voltages of opposite polarities to the first and second electrodes and, in the second configuration, apply voltages of opposite polarities to the second and third electrodes.

According to an embodiment, the first and second piezoelectric layers each have a negative pole on their rear surface side and a positive pole on their front surface side, and the control circuit is configured to, in the first configuration, apply a positive voltage to the first electrode and a negative voltage to the fourth electrode and, in the second configuration, apply a negative voltage to the second electrode and a positive voltage to the third electrode.

According to an embodiment, the first and second piezoelectric layers have opposite polarizations $\vec{P}$, and the control circuit is configured to, in the first configuration, apply voltages of same polarity to the first and fourth electrodes and, in the second configuration, apply voltages of same polarity to the second and third electrodes.

According to an embodiment, the first piezoelectric layer has a positive pole on its rear surface side and a negative pole on its front surface side, and the second piezoelectric layer has a negative pole on its rear surface side and a positive pole on its front surface side, and the control circuit is configured to, in the first configuration, apply a positive voltage to the first electrode and a positive voltage to the fourth electrode and, in the second configuration, apply a positive voltage to the second electrode and a positive voltage to the third electrode.

According to an embodiment, the control circuit is configured to, in a first configuration, apply DC voltages to the first and fourth electrodes and, in the second configuration, apply DC voltages to the second and third electrodes.

According to an embodiment, the control circuit is configured to, in the first configuration, apply variable voltages to the first and fourth electrodes and, in the second configuration, apply variable voltages to the second and third electrodes.

According to an embodiment, the control circuit comprises:

first and second nodes of application of an AC control voltage;

a first diode forward-mounted between the first node and the first electrode; and a second diode reverse-mounted between the second node and the second electrode.

According to an embodiment, the control circuit further comprises a first polarity inversion circuit coupling the first electrode to the fourth electrode, and a second polarity inversion circuit coupling the second electrode to the third electrode.

According to an embodiment, the stack comprising the first and second piezoelectric layers and the first conductive layer forms a membrane suspended on a rigid support.

According to an embodiment, the first and second electrodes are arranged opposite a central portion of the membrane, and the third and fourth electrodes are arranged opposite a peripheral portion of the membrane.

According to an embodiment, the voltages applied by the control circuit on the first, second, third, and fourth electrodes are referenced with respect to the first conductive layer.

Another embodiment provides a method of controlling a piezoelectric transducer comprising:

a first piezoelectric layer made of a non-ferroelectric material, the first layer having a from surface and a rear surface;

a first conductive layer arranged on the front surface of the first piezoelectric layer:

a second piezoelectric layer made of a non-ferroelectric material arranged on the front surface of the first conductive layer;

a first electrode arranged on the front surface of the second piezoelectric layer;

a second electrode arranged on the rear surface of the first piezoelectric layer, opposite the first electrode;

a third electrode arranged on the front surface of the second piezoelectric layer; and a fourth electrode arranged on the rear surface of the first piezoelectric layer, opposite the third electrode, the method comprising:

in a first operating phase, simultaneously applying a non-zero voltage to the first electrode, a non-zero voltage to the fourth electrode, and substantially zero voltages to the second and third electrodes; and in a second operating phase, simultaneously applying a non-zero voltage to the second electrode, a non-zero voltage to the third electrode, and substantially zero voltages to the first and fourth electrodes.

The foregoing and other features and advantages will be discussed in detail in the following non-limiting description of specific embodiments in connection with the accompanying drawings.

DETAILED DESCRIPTION OF THE PRESENT EMBODIMENTS

Figure 1:
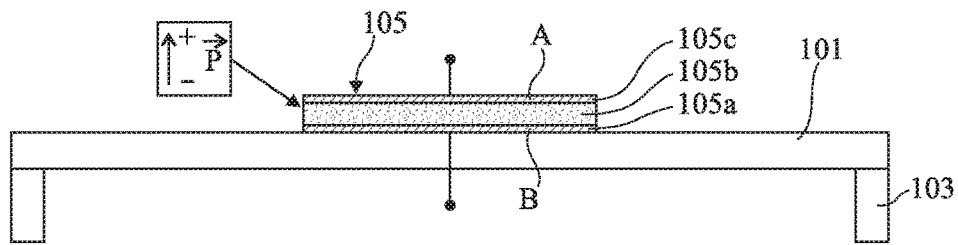
FIG. 1 is a simplified cross-section view of an ex-ample of a piezoelectric transducer.

The same elements have been designated with the same reference numerals in the various drawings and, further, the various drawings are not to scale. For clarity, only those steps and elements which are useful to the understanding of the described embodiments have been shown and are detailed. In particular, the various uses which may be made of the described piezoelectric transducers have not been detailed, the described embodiments being compatible with usual applications of piezo-electric transducers. Further, the methods of manufacturing the described piezoelectric transducer have not been detailed, since the described transducers can be formed by usual piezoelectric transducer manufacturing methods, provided to make possible adaptations which are within the abilities of those skilled in the art on reading of the present disclosure.

The same elements have been designated with the same reference numerals in the various drawings and, further, the various drawings are not to scale. For clarity, only those steps and elements which are useful to the understanding of the described embodiments have been shown and are detailed. In particular, the various uses which may be made of the described piezoelectric transducers have not been detailed, the described embodiments being compatible with usual applications of piezo-electric transducers. Further, the methods of manufacturing the described piezoelectric transducer have not been detailed, since the described transducers can be formed by usual piezoelectric transducer manufacturing methods, provided to make possible adaptations which are within the abilities of those skilled in the art on reading of the present disclosure.

FIG. 1 is a cross-section view schematically illustrating an example of a piezoelectric transducer.

The transducer of FIG. 1 comprises a flexible membrane 101, for example, a resilient membrane, suspended on a rigid support 103. Support 103 for example has the shape of a closed frame or ring, for example, having a circular or, rectangular shape (in top view). As a variation, support 103 has the shape of an open frame or ring, or also of one or a plurality of separate pillars. Support 103 is arranged opposite a peripheral portion of membrane 101, membrane 101 being, in this portion, bonded by its lower surface to the upper surface of support 103. A central portion of the membrane is free to move along a direction orthogonal to the membrane, that is, along a vertical direction in the orientation of FIG. 1.

The transducer of FIG. 1 further comprises a piezoelectric actuator 105 bonded to membrane 101, on the upper surface side of membrane 101 in the shown example. In this example, piezoelectric actuator 105 is arranged opposite a central portion of membrane 101. Actuator 105 comprises a first conductive layer 105a, for example, a metal layer, arranged on the upper surface of the membrane, a piezoelectric layer 105b coating the upper surface of layer 105a and a second conductive layer 105c coating the upper surface of piezoelectric layer 105b. Conductive layers 105c and 105a respectively form a first electrode A and a second electrode B for controlling actuator 105, intended to be connected to a control circuit (not shown) of the transducer.

The application of a voltage between electrodes A and B of the actuator results:

either in a contraction of piezoelectric layer 105b in the direction of the applied electric field, that is, in a direction orthogonal to layer 105b, and thus in an extension of piezoelectric layer 105b perpendicularly to the electric field, that is, parallel to layer 105b;

or in an extension of piezoelectric layer 105b in the direction of the applied electric field, and thus in a contraction of piezoelectric layer 105b perpendicularly to the electric field, that is, parallel to layer 105b.

More particularly, a piezoelectric material conventionally comprises a plurality of elementary dipoles having a preferred direction and orientation, which result in the obtaining of a non-zero macroscopic electrostatic dipole $\vec{P}$ called polarization. In the example of FIG. 1, polarization $\vec{P}$ of piezoelectric layer 105b is orthogonal to layer 105b, the negative pole of layer 105b being on the lower surface side of layer 105b and the positive pole of layer 105b being on the upper surface side of layer 105b. Under such conditions, the application of a positive voltage between electrode A and electrode B of piezoelectric actuator 105 results in a stretching of layer 105b orthogonally to the applied electric field, that is, parallel to membrane 101, resulting in an upward deflection (not shown in the drawing) of the central portion of the membrane. The application of a negative voltage between electrode A and electrode B of piezoelectric actuator 105 conversely results in a contraction of layer 105b parallel to membrane 101, resulting in a downward deflection of the central portion of the membrane.

In the so-called small deformation range, that is, for displacements of the membrane smaller than half the thickness thereof, the deflection of membrane 101, that is, the distance between the center of the membrane when a control voltage is applied between electrodes A and B of the actuator and the center of the membrane when no control voltage is applied between electrodes A and B (in idle position), is substantially proportional to the applied voltage. In the large deformation range, that is, for displacements of the membrane greater than half the thickness thereof, the proportionality relation is no longer verified since the stiffness of the membrane increases along with its deformation.

It is here desired to form a piezoelectric transducer enabling, for a given control voltage level, to increase the membrane deflection, particularly in the large deformation range.

To maximize the amplitude of the displacement of the membrane for a given control voltage, a possibility comprises selecting the piezoelectric material having the highest possible piezoelectric coefficient. For this reason, lead zirconate titanate, generally called LZT, is currently used in piezoelectric transducers.

LZT however has the characteristic of being ferro-electric. Thus, when an electric field is applied thereto, it repolarizes in the direction of the applied field. As a result, in a transducer of the type described in relation with FIG. 1, when piezoelectric layer 105b is made of LZT or, more generally, of any other ferroelectric piezoelectric material, whatever the polarity of the control voltage applied between electrodes A and B, layer 105b may only contract in the direction transverse to the applied electric field. In other words, whatever the polarity of the control voltage applied between electrodes A and B, the membrane displacement direction is always the same (downwards in the example of FIG. 1).

Non-ferroelectric piezoelectric materials such as aluminum nitride (AlN), zinc oxide (ZnO), or polyvinylidene fluoride (PVDF), do not have such a repolarization effect and can thus contract or expand perpendicularly to the applied electric field, which enables to displace the membrane upwards and downwards according to the polarity of the control voltage applied between electrodes A and B.

Figure 2:
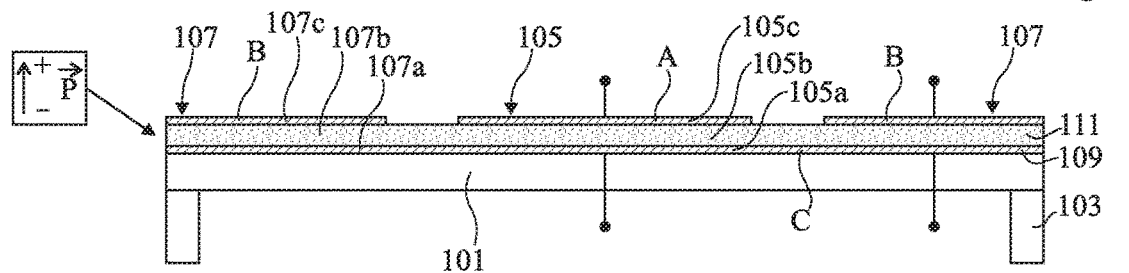
FIG. 2 is a simplified cross-section view of another example of a piezoelectric transducer.

FIG. 2 is a cross-section view schematically illustrating another example of a piezoelectric transducer.

The transducer of FIG. 2 comprises, as in the example of FIG. 1, a flexible membrane 101 suspended on a rigid support 103, and a piezoelectric actuator 105 coating a central portion of membrane 101.

The transducer of FIG. 2 further comprises a piezoelectric actuator 107 coating a peripheral portion of membrane 101. In this example, actuator 107 comprises a first conductive layer 107a, for example, a metal layer, arranged on the upper surface of the membrane, a piezoelectric layer 107b coating the upper surface of layer 107a, and a second conductive layer 107c coating the upper surface of piezoelectric layer 107b.

In this example, lower conductive layer 105a of actuator 105 and lower conductive layer 107a of actuator 107 form part of a same conductive layer 109 continuously extending over the entire upper surface of membrane 101. Further, piezoelectric layer 105b of actuator 105 and piezoelectric layer 107b of actuator 107 form part of a same piezoelectric layer 111 continuously extending over the entire surface of membrane 101. Upper conductive layers 105c of actuator 105 and 107c of actuator 107 are however separate, which allows a differentiated control of the two actuators.

Conductive layers 105c, 107c, and 109 respectively form a first electrode A, a second electrode B, and a third electrode C of control of the transducer, intended to be connected to a control circuit (not shown) of the transducer.

In the case where layer 111 is made of a ferroelectric piezoelectric material, for example, LZT, actuator 105 is used to control the displacement of the membrane in a first direction (downwards in the example of FIG. 2), and actuator 107 is used to control the displacement of the membrane in this other direction (upwards in this example). More particularly, the transducer of FIG. 2 may be controlled to take a first configuration where a non-zero voltage (positive or negative) is applied between electrodes A and C and a substantially zero voltage is applied between electrodes B and C, and to take a second configuration where a non-zero voltage (positive or negative) is applied between electrodes B and C, and a substantially zero voltage is applied between electrodes A and C. In the first configuration, the voltage applied between electrodes A and C causes a contraction of layer 105b perpendicularly to membrane 101, and thus a downward deflection of membrane 101. In the second configuration, the voltage applied between electrodes B and C causes a contraction of layer 107b perpendicularly to membrane 101, and thus an upward deflection of membrane 101.

In the case where layer 111 is made of a non-ferroelectric piezoelectric material such as AlN, voltages having opposite polarities may be simultaneously applied between electrodes A and C on the one hand and between electrodes B and C on the other hand to maximize the amplitude of the membrane displacements. More particularly, the transducer of FIG. 2 may be controlled to take a first configuration where a positive voltage is applied between electrodes A and C and a negative voltage is applied between electrodes B and C, and to take a second configuration where a negative voltage is applied between electrodes A and C and a positive voltage is applied between electrodes B and C. In the case of a piezoelectric layer 111 of polarization $\vec{P}$ orthogonal to layer 111, having its negative pole on the lower surface side of layer 111 and having its positive pole located on the upper surface side of layer 111, an upward displacement of membrane 101 is obtained in the first configuration and a downward displacement of membrane 101 is obtained in the second configuration.

Figure 3:
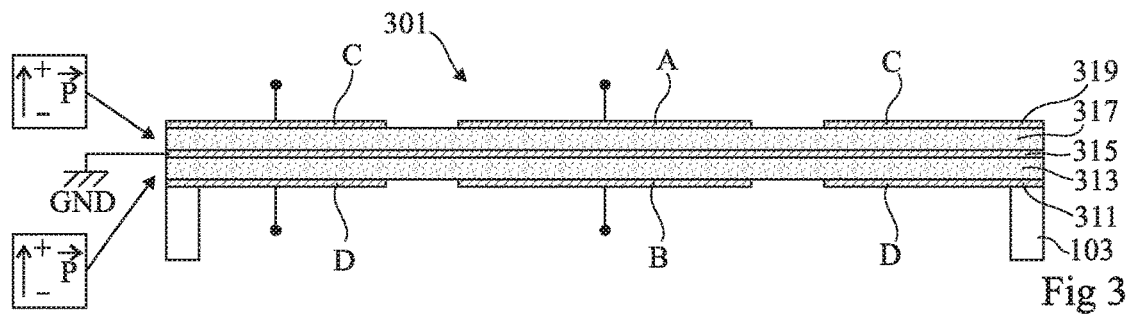
FIG. 3 is a simplified cross-section view of another example of a piezoelectric transducer.

FIG. 3 is a cross-section view schematically illustrating another example of a piezoelectric transducer.

The transducer of FIG. 3 is of bimorph type, that is, it comprises two active piezoelectric layers (as opposed to unimorph-type transducers comprising a single active piezoelectric layer such as described in relation with FIGS. 1 and 2). In this case, flexible layer 101 of the examples of FIGS. 1 and 2, having a purely mechanical function (passive layer), may be removed.

The transducer of FIG. 3 differs from the transducers described in relation with FIGS. 1 and 2 in that, in the example of FIG. 3, passive flexible membrane 101 of the examples of FIGS. 1 and 2 is replaced with an active flexible membrane 301. Membrane 301 is suspended on a rigid support 103 similarly to what has been described in the previous examples.

Membrane 301 comprises a vertical stack comprising, in the following order from the lower surface of the membrane, a first conductive layer 311, for example, a metal layer, a first non-ferroelectric piezoelectric layer 313, for example, made of AlN, of ZnO, of PVDF, or of any other non-ferroelectric piezoelectric material, a second conductive layer 315, for example a metal layer, a second non-ferroelectric piezoelectric 317, and a third conductive layer 319, for example, a metal layer. Piezoelectric layers 313 and 317 are for example made of the same material. Similarly, conductive layers 311, 315, and 319 may be made of the same material.

In this example, piezoelectric layers 313 and 317 and intermediate conductive layer 315 are continuous layers extending substantially over the entire surface of the membrane. Lower and upper conductive layers 311 and 319 are discontinuous. More particularly, layer 311 is discretized to define a first lower electrode B in a central portion of membrane 301, and a second lower electrode D in a peripheral portion of membrane 301. Similarly, layer 319 is discretized to define a first upper electrode A in a central portion of membrane 301 and a second upper electrode C in a peripheral portion of membrane 301. In this example, electrode A is located vertically above electrode B and electrode C is located vertically above electrode D.

Thus, membrane 301 of the piezoelectric transducer of FIG. 3 integrates four piezoelectric actuators defined as follows:

an upper central actuator comprising electrode A, the portion of piezoelectric layer 317 located vertically above electrode A, and the portion of conductive layer 315 located vertically above electrode A;

an upper peripheral actuator comprising electrode C, the portion of piezoelectric layer 317 located vertically above electrode C, and the portion of conductive layer 315 located vertically above electrode C;

a lower central actuator comprising electrode B, the portion of piezoelectric layer 313 located vertically above electrode B, and the portion of conductive layer 315 located vertically above electrode B; and a lower peripheral actuator comprising electrode D, the portion of piezoelectric layer 313 located vertically above electrode D, and the portion of conductive layer 315 located vertically above electrode D.

In this example, piezoelectric layers 313 and 317 have the same direction and the same orientation of polarization $\vec{P}$. More particularly, in the shown example, the negative pole of layer 313 is located on the lower surface side of layer 313, the positive pole of layer 313 is located on the upper surface side of layer 313, the negative pole of layer 317 is located on the loser surface side of layer 317 and the positive pole of layer 317 is located on the upper surface side of layer 317.

Electrodes A, B, C, and D as well as the central electrode formed by intermediate conductive layer 315 are intended to be connected to a control circuit (not shown) of the transducer. In this example, the control voltages applies to electrodes A, B, C, and D of the transducer are all referenced with respect to the central electrode formed by layer 315.

Figure 4:
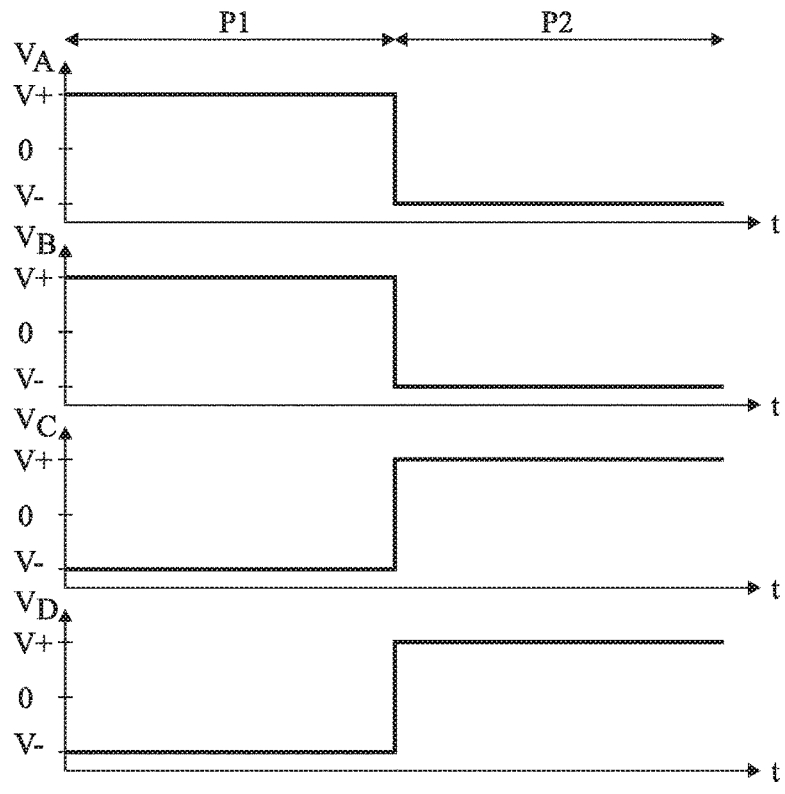
FIG. 4 is a timing diagram illustrating an example of a piezoelectric transducer control method.

FIG. 4 is a timing diagram illustrating an example of a method of controlling the piezoelectric transducer of FIG. 3. FIG. 4 more particularly shows the variation over time (in abscissas) of the control voltages $V_A$, $V_B$, $V_C$, and $V_D$ (in ordinates) respectively applied to electrodes A, B, C, and D of the transducer by the transducer control circuit (not shown). As previously indicated, control voltages $V_A$, $V_B$, $V_C$, and $V_D$ are all referenced with respect to central electrode 315 of the transducer. As an example, the central electrode is connected to a node GND of application of a reference potential of the control circuit, for example, a 0-V potential, for example, the ground.

In this example, the transducer control circuit is configured to control the transducer to one or the other of first and second configurations, respectively corresponding to phase P1 and to phase P2 of the timing diagram of FIG. 4.)

In the first configuration (phase P1), a positive voltage V+ is applied to electrode A, a positive voltage, for example, of same level V+, is applied to electrode B, a negative voltage V− is applied to electrode C, and a negative voltage, for example, of same level V−, is applied to electrode D.

In the second configuration (phase P2), a negative voltage V− is applied to electrode. A, a negative voltage, for example, of same level V−, is applied to electrode B, a positive voltage V+ is applied to electrode C, and a positive voltage, for example, of same level V+, is applied to electrode D.

In the first configuration, a stretching of piezoelectric layer 317 in its central portion (opposite electrode A), a contraction of piezoelectric layer 317 in its peripheral portion (opposite electrode C), a contraction of piezoelectric layer 313 in its central portion (opposite electrode B), and a stretching of piezoelectric layer 313 in its peripheral portion (opposite electrode D) are obtained in the direction orthogonal to membrane 301. This results in an upward displacement of membrane 301.

In the second configuration, a contraction of piezo-electric layer 317 in its central portion (opposite electrode A), a stretching of piezoelectric layer 317 in its peripheral portion (opposite electrode C), a stretching of piezoelectric layer 313 in its central portion (opposite electrode B), and a contraction of piezoelectric layer 313 in its peripheral portion (opposite electrode D) are obtained in the direction orthogonal to membrane 301. This results in a downward displacement of membrane 301.

The transducer of FIG. 3 combined with the control mode of FIG. 4 enables to achieve membrane deflections of larger amplitude than those which can be obtained with transducers of the type described in relation with FIGS. 1 and 2.

Surprisingly, the inventors have however observed that in a transducer of the type described in relation with FIG. 3, it is possible to obtain still greater deflection amplitudes by only activating the actuators causing a stretching of the piezoelectric layer, that is, in the above-described example, the upper central actuator and the lower peripheral actuator in the first configuration, and the lower central actuator and the upper peripheral actuator in the second configuration, and by deactivating (that is, by maintaining in the idle state) the other actuators, that is in the above-described example, the lower central actuator and the upper peripheral actuator in the first configuration and the upper central actuator and the lower peripheral actuator in the second configuration.

Figure 5:
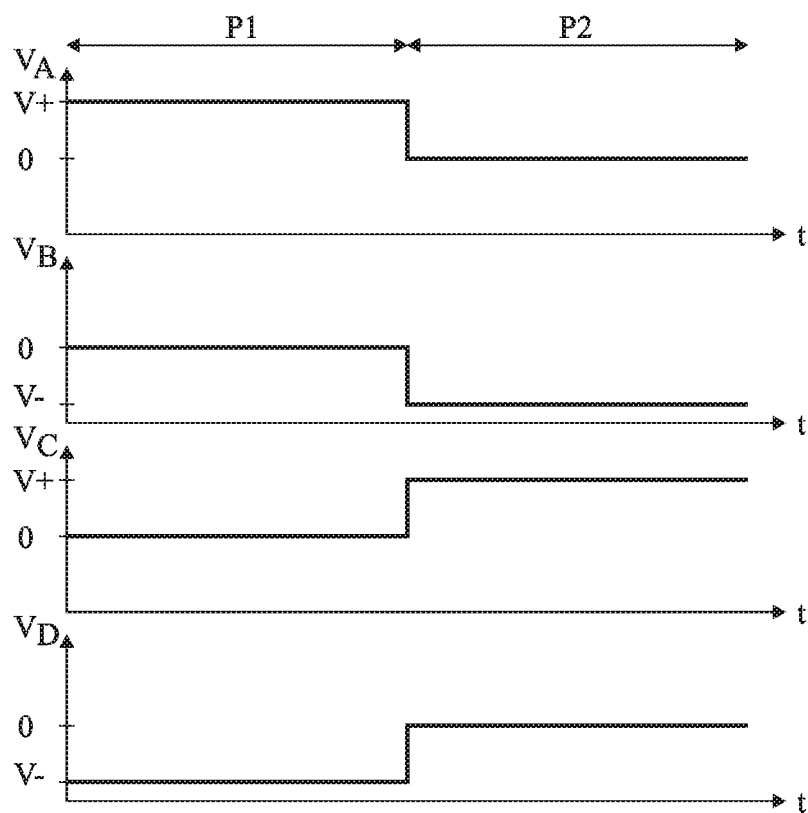
FIG. 5 is a timing: diagram illustrating an example of a method of controlling a piezoelectric transducer according to an embodiment.

FIG. 5 is a timing diagram illustrating an example of a method of controlling a piezoelectric transducer according to an embodiment. A transducer of the type described in relation with FIG. 3 is considered herein. FIG. 5 shows the variation over time (in abscissas) of control voltages $V_A$, $V_B$, $V_C$, and $V_D$ (in ordinates) respectively applied to electrodes A, B, C, and D of the transducer by the transducer control circuit (not shown). As previously, control voltages $V_A$, $V_B$, $V_C$ and $V_D$ are all referenced with respect to central electrode 315 of the transducer. As an example, the central electrode is connected to a node GND of application of a reference potential of the control circuit, for example, a 0-V potential, for example, the ground.

In this example, the transducer control circuit is configured to control the transducer to one or the other of first and second configurations, respectively corresponding to phase P1 and to phase P2 of the timing, diagram of FIG. 5.

In the first configuration (phase P1), a positive voltage V+ applied to electrode A, a substantially zero voltage is applied to electrode B, a substantially zero voltage is, applied to electrode C, and a negative voltage V− is applied to electrode D. Substantially zero voltage here means a voltage close to the reference voltage of node GND, for example, equal to within 10 mV to the reference voltage of node GND. Positive and negative voltages V+ and V− have a level capable of causing a significant deformation of the piezoelectric layer in the corresponding actuator. As an example, voltages V+ and V− are greater than 5 V in absolute value. Voltages V+ and V− are for example substantially equal in absolute value.

In the second configuration (phase P2), a substantially zero voltage is applied to electrode A, a negative voltage V− is applied to electrode B, a positive voltage V+ is applied to electrode C, and a substantially zero voltage is applied to electrode D.

Figure 6:
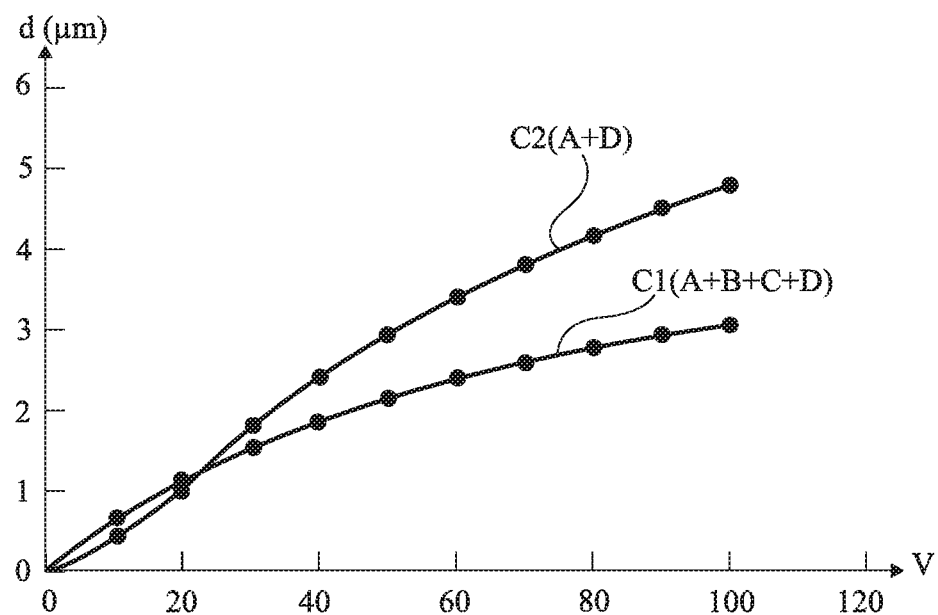
FIG. 6 is a diagram illustrating an advantage of the control method of FIG. 5.

In the first configuration, a stretching of piezo-electric layer 317 in its central portion (opposite electrode A) and a stretching of piezoelectric layer 313 in its peripheral portion (opposite electrode D) are obtained in the direction orthogonal to membrane 301. This results in an upward displacement of membrane 301. Piezoelectric layer 317 however remains at rest in its peripheral portion (opposite electrode C) and piezoelectric layer 313 remains at rest in its central portion (opposite electrode B). As illustrated in FIG. 6 detailed hereafter, this enables, as compared with the previously-described control mode where the upper peripheral actuator and the lower central actuator are activated in contraction mode, to further increase the membrane deflection, particularly in the large deformation range.

In the second configuration, a stretching of piezoelectric layer 317 in its peripheral portion (opposite electrode C) and a stretching of piezoelectric layer 313 in its central portion (opposite electrode B) are obtained in the direction orthogonal to membrane 301. This results in a downward displacement of membrane 301. Piezoelectric layer 317 however remains at rest in its central portion (opposite electrode A) and piezoelectric layer 313 remains at rest in its peripheral portion (opposite electrode D). Here again, this enables, as compared with the previously-described control mode where the lower peripheral actuator and the upper peripheral actuator are activated in contraction mode, to increase the membrane deflection, particularly in the large deformation range.

FIG. 6 is a diagram illustrating an advantage of the control mode described in relation with FIG. 5 over the control mode described in relation with FIG. 4. The diagram of FIG. 6 shows the variation of displacement d of the membrane at its center and along a direction orthogonal to the membrane (in ordinates, in micrometers) according to voltage level V (in abscissas, in volts) applied to the control electrodes of the transducer (with, in this example). The diagram of FIG. 6 more particularly comprises two curves C1 and C2. Curve C1 shows the variation of the membrane displacement according to the control voltage level when the transducer is controlled to take the first configuration (P1) of the control method of FIG. 4, that is, when the four actuators respectively defined by electrodes A, B, C, and D are activated in combination to generate an upward displacement of membrane 301. Curve C2 shows the variation of the membrane displacement according to the control voltage level when the transducer is controlled to take the first configuration (P1) of the control method of FIG. 5, that is, when only actuators A and D are activated to generate an upward displacement of membrane 301.

As shown in FIG. 6, up to a certain membrane displacement amplitude, in the order of 1 μm, in the present example (corresponding in the present example to a control voltage level in the order of 5 V), the membrane displacement is substantially proportional to level V of the control voltage applied to the transducer (and to the number of activated actuators). This operating range corresponds to the so-called small deformation range, in this operating range, the control method of FIG. 4 (curve C1) is approximately twice as efficient as the control method of FIG. 5 (curve C2).

For greater deformations of the membrane, displacement d of the membrane is no longer proportional to the applied control voltage level V. Such an operating range corresponds to the so-called large deformation range. Surprisingly, it can be observed that, in this operating range, for a sufficiently high control voltage level V (for a control voltage level V greater than approximately 20 V in the shown example), the deflection of membrane 301 is significantly larger when the transducer is controlled according to the method of FIG. 5 than when the transducer is controlled according to the method of FIG. 4. Although the corresponding curves have not been shown in FIG. 6, a similar advantage is obtained when the transducer is controlled to take the second configuration (phases P2 of the control methods of FIGS. 4 and 5, resulting in a downward displacement of membrane 301).

It should be noted that in the example of FIG. 5, the control voltages applied to the transducer in the first and second configurations are DC voltages. A DC voltage control may for example be used to form an electromechanical actuator, for example, for actuating a micro-pump, a micro-valve, a mobile micro-mirror, etc.

The described embodiments are however not limited to this specific case. As a variation, the control voltages applied to the transducer may be variable voltages. A variable voltage control may for example be used to form air acoustic wave generator, for example, for applications of echolocation, non-destructive ultrasound control, or also to form a loudspeaker.

Figure 7:
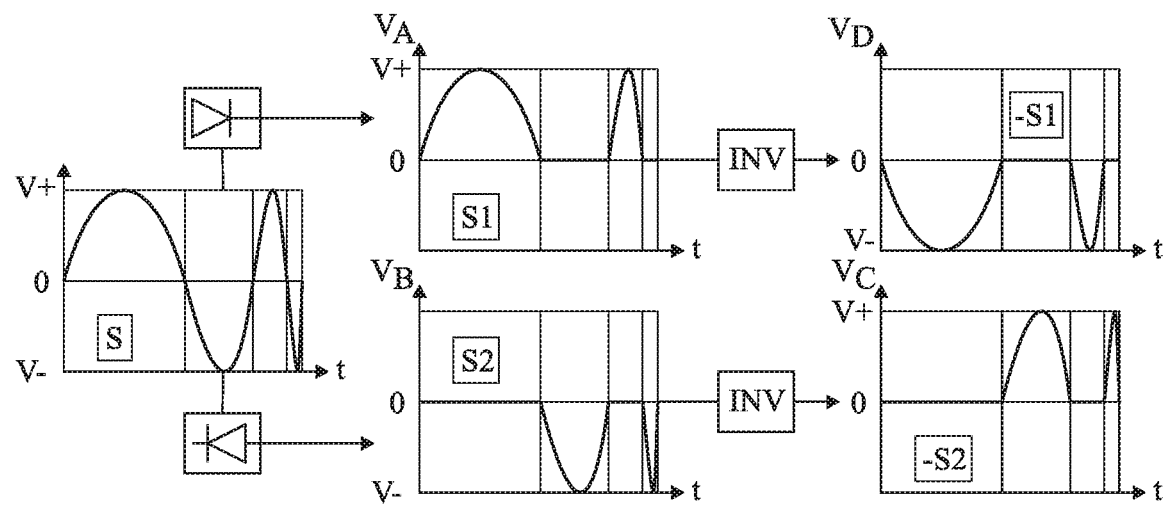
FIG. 7 illustrates another example of a method of controlling a piezoelectric transducer according to an embodiment.

FIG. 7 illustrates an example of a method of con-trolling a piezoelectric transducer according to an embodiment. A transducer of the type described in relation with FIG. 3 is considered herein. In this example, the control voltages applied to the transducer are variable voltages.

FIG. 7 comprises, in its left-hand portion, a diagram showing a base control voltage S representative of the displacement which is desired to be applied to the membrane. Voltage S is an AC voltage alternating between a positive peak voltage V+ and a negative peak voltage V−. Voltage S is referenced with respect to intermediate electrode 315 of the transducer.

FIG. 7 further comprises, in its right-hand portion, four diagrams respectively showing the voltages $V_A$, $V_B$, $V_C$, and $V_D$ applied to electrodes A, B, C, and D of the transducer.

It is here provided, in positive phases of control voltage S, to only activate the upper central actuator and the lower peripheral actuator of membrane 301 and, in negative phases of control voltage S, to only activate the upper peripheral actuator and the lower central actuator of membrane 301.

More particularly, in this example, one applies:
to electrode A, a control voltage $V_A$=S1 substantially equal to voltage S in positive phases of voltage S and substantially zero in negative phases of voltage S;
to electrode B, a control voltage $V_B$=S2 substantially equal to voltage S in negative phases of voltage and substantially zero in positive phases of voltage S;
to electrode D, a control voltage $V_D$=S1; and
to electrode C, a control voltage $V_C$=−S2.

As an example, voltage S1 (electrode A) is generated from voltage S by means of a halfwave rectifier, voltage S2 (electrode B) is generated from voltage S by means of a reverse halfwave rectifier, voltage −S1 (electrode D) is generated by means of a polarity inverter from voltage S1, and voltage −S2 (electrode C) is generated by means of a polarity inverter from voltage S2.

Figure 8:
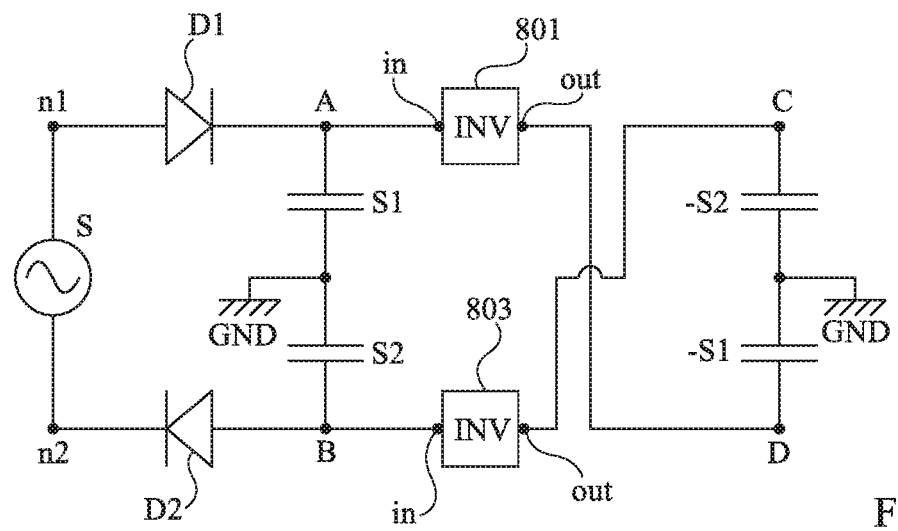
FIG. 8 is a simplified electric diagram of an example of a circuit for controlling a piezoelectric transducer according to an embodiment.

FIG. 8 is a simplified electric diagram of a piezo-electric transducer control circuit capable of implementing the control method of FIG. 7.

The control circuit of FIG. 8 comprises input nodes n1 and n2 having base control voltage S, referenced with respect to node GND (connected to intermediate electrode 315 of the transducer), applied therebetween. The control circuit of FIG. 8 further comprises a diode D1 forward-mounted between node n1 and electrode A of the transducer, and a diode D2 reverse-mounted between node n2 and electrode B of the transducer. More particularly, in this example, diode D1 has its anode connected to node n1 and its cathode connected to electrode A, and diode D2 has its anode connected to electrode B and its cathode connected to node n2. The control circuit of FIG. 8 further comprises a first polarity inversion circuit 801 (INV) having an input node in coupled, for example, connected, to electrode A and having an output node out coupled, for example, connected, to electrode D, and a second polarity inversion circuit 803 (INV), for example, identical to circuit 801, having an input node in coupled, for example, connected, to electrode B and having an output node coupled, for example, connected, to electrode C.

Thus, the control circuit of FIG. 8 enables, from base control voltage S, to generate control voltage S1 applied to electrode A, control voltage S2 applied to electrode B, control voltage −S1 applied to electrode D, and control voltage −S2 applied to electrode C.

Figure 9:
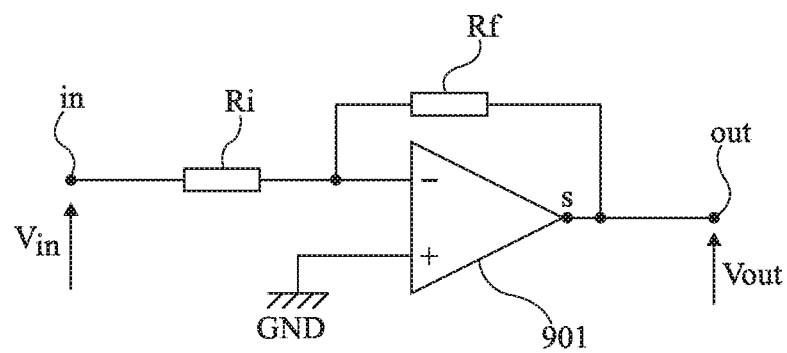
FIG. 9 is a more detailed electric diagram of an embodiment of a circuit for inverting the polarity of the control circuit of FIG. 8.

FIG. 9 is an electric diagram of an embodiment of a polarity inversion circuit 801 or 803 of the control circuit of FIG. 8. In this example, the polarity inversion circuit comprises an operational amplifier 901 having its positive input (+) coupled, for example, connected, to node GND, and having its negative input (−) coupled to input node in of the circuit via a resistor Ri. The circuit of FIG. 9 further comprises a resistor Rf coupling output node s of the operational amplifier to the negative input thereof (−). Output node out of the polarity inversion circuit is coupled, for example, connected, for output node s of the operational amplifier.

Output voltage Vout of the circuit of FIG. 9 can be expressed as a function of input voltage Vin, of gain G of the amplifier, of input resistance Ri, and of feedback resistance Rf, as follows:

$$Vout = -\frac{Rf * Vin * G}{Rf + Ri * (1 + G)}$$

Considering a sufficiently high gain value G, the equation can be simplified as follows:

$$Vout = -\frac{Rf * Vin}{Ri}$$

Taking substantially equal resistance values Ri and Rf, one effectively has Vout=−Vin.

Figure 10:
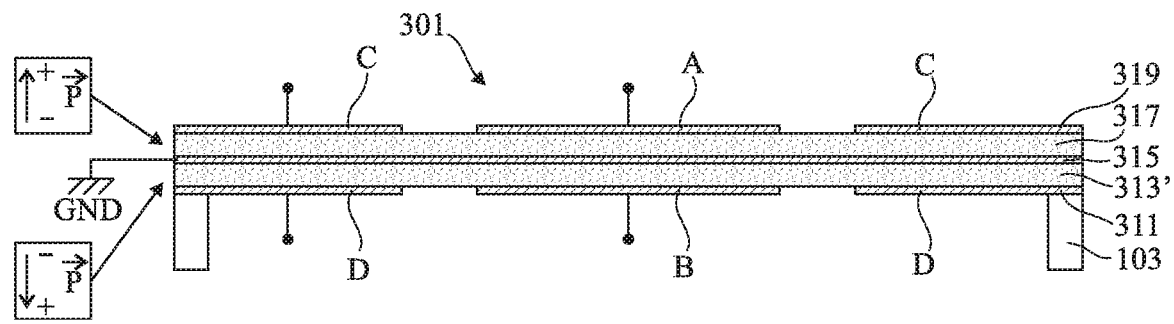
FIG. 10 is a simplified cross-section view of another example of a piezoelectric transducer according to an embodiment.

FIG. 10 is a cross-section view of an alternative embodiment of a piezoelectric transducer. The transducer of FIG. 10 is identical or similar to transducer 301 of FIG. 3, with the difference that, in the example of FIG. 10, lower piezoelectric layer 313 of the transducer of FIG. 3 is replaced with a piezoelectric layer 313' similar to layer 313 but having a polarization $\vec{P}$ respect to layer 313.

Thus, in the example of FIG. 10, piezoelectric layers 313' and 317 have the same polarization direction, orthogonal to the membrane, but have opposite polarization orientations. More particularly, in the shown example, the positive pole of layer 313' is located on the lower surface side of layer 313', the negative pole of layer 313' is located on the upper surface side of layer 313', the negative pole of layer 317 is located on the lower surface side of layer 317, and the positive pole of layer 317 is located on the upper surface side of layer 317.

Figure 11:
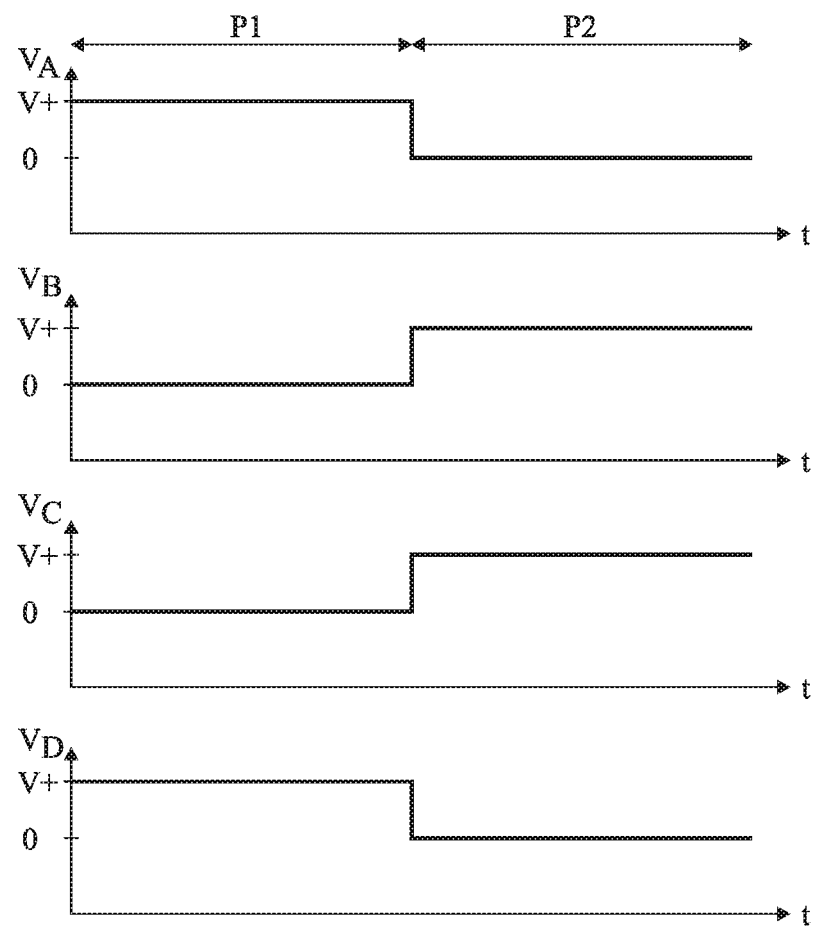
FIG. 11 is a timing diagram illustrating an example of a method of controlling the transducer of FIG. 10.

FIG. 11 is a timing diagram illustrating an embodiment of a method of controlling the piezoelectric transducer of FIG. 10. FIG. 11 shows the variation, over time (in abscissas) of the control voltages $V_A$, $V_B$, $V_C$, and $V_D$ (in ordinates) respectively applied to electrodes A, B, C, and D of the transducer by the transducer control circuit (not shown). As previously, control voltages $V_A$, $V_B$, $V_C$, and $V_D$ are all referenced with respect to the central electrode 315 of the transducer, coupled to a node GND of application of a reference potential of the control circuit.

In this example, the transducer control of circuit is configured to control the transducer to one or the other of first and second configurations, respectively corresponding to phase P1 and to phase P2 of the timing diagram of FIG. 5.

In the first configuration (phase P1), a positive voltage V+ is applied to electrode A, a substantially zero voltage is applied to electrode B, a substantially zero voltage is applied to electrode C, and a positive voltage V+ is applied to electrode D.

In the second configuration (phase P2), a substantially zero voltage is applied to electrode A, a positive voltage V+ is applied to electrode B, a positive voltage V+ is applied to electrode C, and a substantially zero voltage is applied to electrode D.

In the first configuration, a stretching of piezo-electric layer 317 in its central portion (opposite electrode A) and a stretching of piezoelectric layer 313' in its peripheral portion (opposite electrode D) are obtained in the direction orthogonal to membrane 301. This results in an upward displacement of membrane 301. Piezoelectric layer 317 however remains at rest in its peripheral portion (opposite electrode C) and piezoelectric layer 313' remains at rest in its central portion (opposite electrode B). As in the example of FIG. 5, this enables, as compared with a control mode where the upper peripheral actuator and the lower central actuator are activated in contraction mode, to increase the membrane deflection, particularly in the large deformation range.

In the second configuration, a stretching of piezo-electric layer 317 in its peripheral portion (opposite electrode C) and a stretching of piezoelectric layer 313' in its central portion (opposite electrode B) are obtained in the direction orthogonal to membrane 301. This results in a downward displacement of membrane 301. Piezoelectric layer 317 however remains at rest in its central portion (opposite electrode A) and piezoelectric layer 313' remains at rest in its peripheral portion (opposite electrode D). Here again, this enables, as compared with a control mode where the lower peripheral actuator and the upper peripheral actuator are activated in contraction mode, to increase the membrane deflection, particularly in the large deformation range.

As a variation, the transducer of FIG. 10 may be controlled by a variable voltage similarly to what has been described in relation with FIG. 7. In this case, positive voltage S1 is applied to electrode A and to electrode D, and negative voltage S2 is applied to electrode B and to electrode C, which enables to simplify the control circuit. In particular, polarity inversion circuits 801 and 803 of the control circuit of FIG. 8 can then be omitted.

Specific embodiments have been described. Various alterations, modifications, and improvements will occur to those skilled in the art. In particular, the described embodiments are not limited to the above-described examples of membrane shapes and of arrangement of the actuators.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A piezoelectric transducer circuit comprising:
   a first piezoelectric layer made of a non-ferroelectric material, the first layer having a front surface and a rear surface;
   a first conductive layer arranged on the front surface of the first piezoelectric layer;
   a second piezoelectric layer made of a non-ferroelectric material arranged on the front surface of the first conductive layer;
   a first electrode arranged on the front surface of the second piezoelectric layer;
   a second electrode arranged on the rear surface of the first piezoelectric layer, opposite the first electrode;
   a third electrode arranged on the front surface of the second piezoelectric layer;
   a fourth electrode arranged on the rear surface of the first piezoelectric layer, opposite the third electrode; and
   a control circuit configured to:
   in first operating phase, simultaneously apply a non-zero voltage to the first electrode, a non-zero voltage to the fourth electrode, and substantially zero voltages to the second and third electrodes; and
   in a second operating phase, simultaneously apply a non-zero voltage to the second electrode, a non-zero voltage to the third electrode, and substantially zero voltages to the first and fourth electrodes.

2. The transducer of claim 1, wherein the first and second piezoelectric layers have identical polarizations $\vec{P}$, and wherein the control circuit is configured to, in the first configuration, apply voltages of opposite polarities to the first and fourth electrodes and, in the second configuration, apply voltages of opposite polarities to the second and third electrodes.

3. The transducer of claim 2, wherein the first and second piezoelectric layers each have a negative pole on their rear surface side and a positive pole on their front surface side, and wherein the control circuit is configured to, in the first configuration, apply a positive voltage to the first electrode and a negative voltage to the fourth electrode and, in the second configuration, apply a negative voltage to the second electrode and a positive voltage to the third electrode.

4. The transducer of claim 1, wherein the first and second piezoelectric layers have opposite polarizations $\vec{P}$, and wherein the control circuit is configured to, in the first configuration, apply voltages of same polarity to the first and fourth electrodes and, in the second configuration, apply voltages of same polarity to the second and third electrodes.

5. The transducer of claim 4, wherein the first piezoelectric layer has a positive pole on its rear surface side and a negative pole on its front surface side, and the second piezoelectric layer has a negative pole on its rear surface side and a positive pole on its front surface side, and wherein the control circuit is configured to, in the first configuration, apply a positive voltage to the first electrode and a positive voltage to the fourth electrode and, in the second configuration, apply a positive voltage to the second electrode and a positive voltage to the third electrode.

6. The transducer of claim 1, wherein the control circuit is configured to, in the first configuration, apply DC voltages to the first and fourth electrodes and, in the second configuration, apply DC voltages to the second and third electrodes.

7. The transducer of claim 1, wherein the control circuit is configured to, in the first configuration, apply variable voltages to the first and fourth electrodes and, in the second configuration, apply variable voltages to the second and third electrodes.

8. The transducer of claim 7, wherein the control circuit comprises:
   first and second nodes of application of an AC control voltage;
   a first diode forward-mounted between the first node and the first electrode; and
   a second diode reverse-mounted between the second node and the second electrode.

9. The transducer of claim 8, wherein the control circuit further comprises a first polarity inversion circuit coupling the first electrode to the fourth electrode and a second polarity inversion circuit coupling the second electrode to the third electrode.

10. The transducer of claim 1, wherein the stack comprising the first and second piezoelectric layers and the first conductive layer forms a membrane suspended on a rigid support.

11. The transducer of claim 10, wherein the first and second electrodes are arranged opposite a central portion of the membrane and wherein the third and fourth electrodes are arranged opposite a peripheral portion of the membrane.

12. The transducer of claim 1, wherein the voltages applied by the control circuit to the first, second, third, and fourth electrodes are referenced with respect to the first conductive layer.

13. A method of controlling a piezoelectric transducer comprising:
- a first piezoelectric layer made of a non-ferroelectric material, the first layer having a front surface and a rear surface;
- a first conductive layer arranged on the front surface of the first piezoelectric layer;
- a second piezoelectric layer made of a non-ferroelectric material arranged on the front surface of the first conductive layer;
- a first electrode arranged on the front surface of the second piezoelectric layer;
- a second electrode arranged on the rear surface of the first piezoelectric layer, opposite the first electrode;
- a third electrode arranged on the front surface of the second piezoelectric layer; and
- a fourth electrode arranged on the rear surface of the first piezoelectric layer, opposite the third electrode, the method comprising:
- in a first operating phase, simultaneously applying a non-zero voltage to the first electrode, a non-zero voltage to the fourth electrode, and substantially zero voltages to the second and third electrodes; and
- in a second operating phase, simultaneously applying a non-zero voltage to the second electrode, a non-zero voltage to the third electrode, and substantially zero voltages to the first and fourth electrodes.

* * * * *